(12) United States Patent
Taguchi

(10) Patent No.: US 9,867,274 B2
(45) Date of Patent: Jan. 9, 2018

(54) CIRCUIT BOARD AND ELECTRONIC APPARATUS

(71) Applicant: FUJITSU LIMITED, Kawasaki-shi, Kanagawa (JP)

(72) Inventor: Jun Taguchi, Miura (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/804,748

(22) Filed: Jul. 21, 2015

(65) Prior Publication Data

US 2016/0050743 A1 Feb. 18, 2016

(30) Foreign Application Priority Data

Aug. 13, 2014 (JP) .................................. 2014-164664

(51) Int. Cl.
*H05K 1/02* (2006.01)
*H05K 1/14* (2006.01)

(52) U.S. Cl.
CPC ........... *H05K 1/0203* (2013.01); *H05K 1/144* (2013.01); *H05K 1/0206* (2013.01); *H05K 2201/0311* (2013.01); *H05K 2201/042* (2013.01); *H05K 2201/09754* (2013.01); *H05K 2201/1028* (2013.01); *H05K 2201/10409* (2013.01); *H05K 2201/10598* (2013.01)

(58) Field of Classification Search
CPC ................. H05K 1/0203; H05K 1/144; H05K 2201/10409; H05K 2201/042; H05K 1/0206; H05K 2201/10598; H05K 2201/0311; H05K 2201/09754; H05K 2201/1028

See application file for complete search history.

(56) References Cited

U.S. PATENT DOCUMENTS

| | | | | |
|---|---|---|---|---|
| 5,305,185 A | * | 4/1994 | Samarov | H01L 23/4006 165/185 |
| 5,390,078 A | * | 2/1995 | Taylor | H05K 1/141 165/80.3 |
| 5,500,556 A | * | 3/1996 | Kosugi | H01L 23/433 257/718 |
| 2003/0002268 A1 | * | 1/2003 | Dibene, II | G06F 1/18 361/784 |
| 2003/0062541 A1 | * | 4/2003 | Warner | H01F 17/0033 257/200 |

(Continued)

FOREIGN PATENT DOCUMENTS

| JP | 2003-174242 | 6/2003 |
|---|---|---|
| JP | 2006-66729 | 3/2006 |

(Continued)

OTHER PUBLICATIONS

Extended European Search Report dated Feb. 2, 2016 in corresponding European Patent Application No. 15177921.2.

*Primary Examiner* — Adam B Dravininkas
(74) *Attorney, Agent, or Firm* — Staas & Halsey LLP

(57) ABSTRACT

A circuit board includes a plate member capable of holding a printed circuit board, the printed circuit board including an electronic component, and a cooling member provided on the electronic component, the printed circuit board and the electronic component being positioned between the plate member and the cooling member; and a circuit provided to the plate member and allowed to be electrically connected with the printed circuit board.

10 Claims, 3 Drawing Sheets

(56) References Cited

U.S. PATENT DOCUMENTS

| | | | |
|---|---|---|---|
| 2003/0214800 A1* | 11/2003 | Dibene, II | G06F 1/18 |
| | | | 361/803 |
| 2004/0084764 A1* | 5/2004 | Ishimine | H01L 23/4006 |
| | | | 257/706 |
| 2004/0212964 A1* | 10/2004 | Belady | H01L 23/36 |
| | | | 361/704 |
| 2004/0264114 A1 | 12/2004 | Hachiya | |
| 2006/0043548 A1* | 3/2006 | Kanda | H05K 3/303 |
| | | | 257/678 |
| 2007/0267735 A1* | 11/2007 | Awano | H01L 21/6835 |
| | | | 257/692 |
| 2007/0278669 A1* | 12/2007 | Hierholzer | H05K 3/325 |
| | | | 257/718 |
| 2010/0200280 A1* | 8/2010 | Tamura | H05K 7/1069 |
| | | | 174/255 |

FOREIGN PATENT DOCUMENTS

| | | |
|---|---|---|
| JP | 2006-253580 | 9/2006 |
| WO | WO 2014/074045 A1 | 5/2014 |

\* cited by examiner

CIRCUIT BOARD AND ELECTRONIC APPARATUS

CROSS-REFERENCE TO RELATED APPLICATION

This application is based upon and claims the benefit of priority of the prior Japanese Patent Application No. 2014-164664, filed on Aug. 13, 2014, the entire contents of which are incorporated herein by reference.

FIELD

The embodiment discussed herein is related to a circuit board and an electronic apparatus.

BACKGROUND

The electric current supplied to electronic components mounted on a board, and the packaging density and the transmission speed of such electronic components have been increasing. In recent years, several improved techniques of mounting electronic components on a board have been proposed (see Japanese Laid-open Patent Publications No. 2006-66729, No. 2003-174242, and No. 2006-253580, for example).

SUMMARY

According to an aspect of the invention, a circuit board includes a plate member capable of holding a printed circuit board, the printed circuit board including an electronic component, and a cooling member provided on the electronic component, the printed circuit board and the electronic component being positioned between the plate member and the cooling member; and a circuit provided to the plate member and allowed to be electrically connected with the printed circuit board.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Increasing the size of wiring lines provided on a board carrying electronic components makes it difficult to increase the packaging density and the transmission speed of the electronic components. To increase the electric current supplied to electronic components while increasing the packaging density and the transmission speed of the electronic components, the thickness of the wiring lines on the board may be increased, for example. However, increasing the thickness of the wiring lines on the board makes it difficult to form a circuit. For example, suppose that a via hole, whose diameter is reduced as the packaging density and the transmission speed increase, is to be formed in a wiring line by using a drill. In such a case, when the wiring line is thick, the drill tends to be broken.

In view of the above, the embodiment discussed herein provides a circuit board and an electronic apparatus each including electronic components that are operable on a simply processed board with an increased current, at an increased packaging density, and at an increased transmission speed.

Hereinafter, an embodiment will be described. The following embodiment is only exemplary and does not limit the technical scope of the present disclosure.

Figure 1:
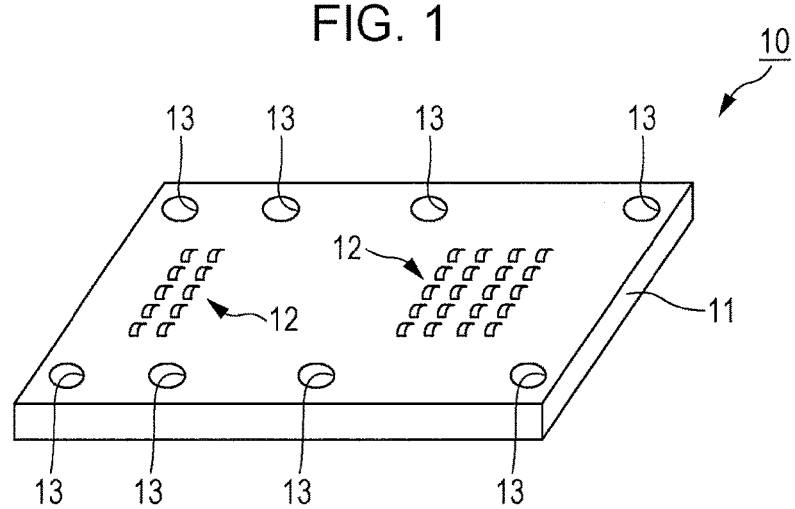
FIG. 1 illustrates an exemplary circuit board according to an embodiment.

FIG. 1 illustrates an exemplary circuit board 10 according to the embodiment. The circuit board 10 includes a plate member 11 and a circuit provided on the plate member 11. The plate member 11 of the circuit board 10 includes terminals 12 provided on a surface thereof, and holes 13. The plate member 11 is capable of holding a printed circuit board, electronic components mounted on the printed circuit board, and a cooling member provided over the electronic components, with the printed circuit board and the electronic components being positioned between the plate member 11 and the cooling member. The terminals 12 are conductive members that allow connection-object terminals provided on the printed circuit board carrying the electronic components and the circuit provided on the plate member 11 to be connected to each other. The terminals 12 are spring-like members that are elastically deformable.

Figure 2:
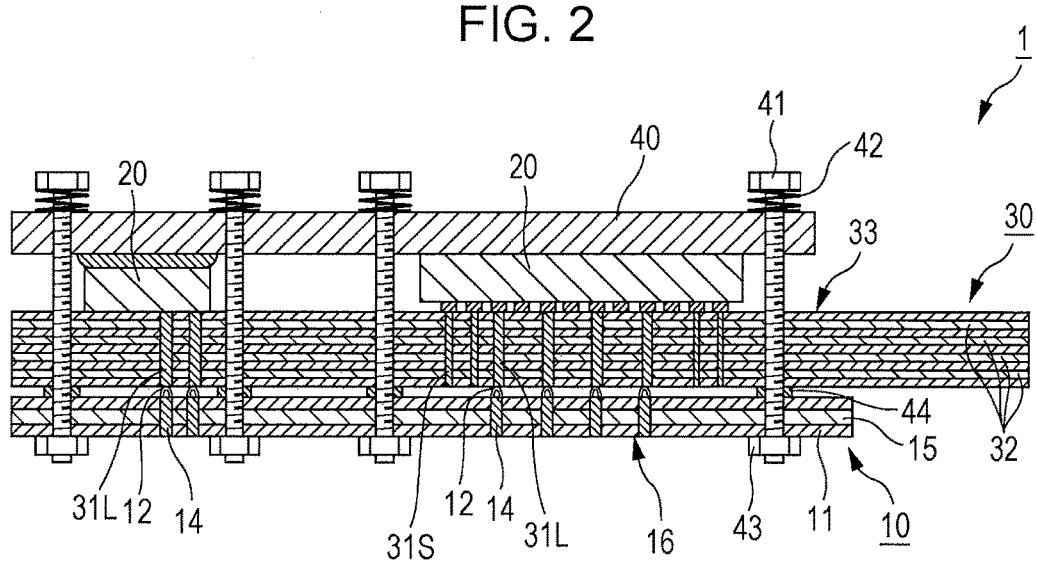
FIG. 2 illustrates an exemplary electronic apparatus including the circuit board according to the embodiment.

FIG. 2 illustrates an exemplary electronic apparatus 1 including the circuit board 10 according to the embodiment. The electronic apparatus 1 includes a printed circuit board 30 on which electronic components 20 that dissipate heat are mounted, and a heat sink 40 (an example of "cooling member" according to the present disclosure) provided over the electronic components 20. The printed circuit board 30 with the electronic components 20 mounted thereon is held between the circuit board 10 and the heat sink 40 provided over the electronic components 20. The printed circuit board 30 includes a circuit 33 including large-diameter vias 31L, small-diameter vias 31S, and wiring layers 32. The circuit 33 is designed such that a current flowing through the large-diameter vias 31L is higher than a current flowing through the small-diameter vias 31S.

As illustrated in FIG. 2 as a sectional view of the circuit board 10, the circuit board 10 includes vias 14 provided at positions corresponding to the large-diameter vias 31L provided in the printed circuit board 30. The terminals 12 allow the vias 14 to be electrically connected with the large-diameter vias 31L. The vias 14 are also electrically connected with a wiring layer 15 embedded in the plate member 11 of the circuit board 10. The wiring layer 15 of the circuit board 10 is made of conductive plate or foil that is thicker than each of the wiring layers 32 of the printed circuit board 30. Hence, a circuit 16 including the vias 14 and the wiring layer 15 provided in the circuit board 10 may bear a higher current than the circuit 33 included in the printed circuit board 30.

The circuit board 10 is fixed with bolts 41 that fasten the heat sink 40 and the plate member 11 together. A compression spring 42 that exerts a repulsive force when compressed is provided around a head-side part of each of the bolts 41. A nut 43 is screwed on the end of each of the bolts 41. The compression springs 42 through which the respective bolts 41 extend urge the heat sink 40 toward the printed circuit board 30. The heat sink 40 thus urged by the compression springs 42 is in close contact with the electronic components 20 on the printed circuit board 30. Since the heat sink 40 is in close contact with the electronic components 20, the heat dissipated from the electronic components 20 is effectively transferred to the heat sink 40.

The bolts 41 extend through the respective holes 13 provided in the plate member 11. The repulsive forces exerted by the compression springs 42 that urge the heat sink 40 toward the printed circuit board 30 act on the heads of the respective bolts 41. Accordingly, the circuit board 10 receives a force that urges the circuit board 10 toward the printed circuit board 30 from the nuts 43 screwed on the respective bolts 41. Consequently, the terminals 12 provided on the plate member 11 are pressed against the printed circuit board 30, whereby the circuit 16 of the circuit board 10 is electrically connected with the circuit 33 of the printed circuit board 30. Spacers 44 are interposed between the circuit board 10 and the printed circuit board 30. The spacers 44 are each an annular member through which a corresponding one of the bolts 41 extends. The spacers 44 adjust the gap between the circuit board 10 and the printed circuit board 30 to such an extent that the elastically deformable terminals 12 are not squashed.

Figure 3:
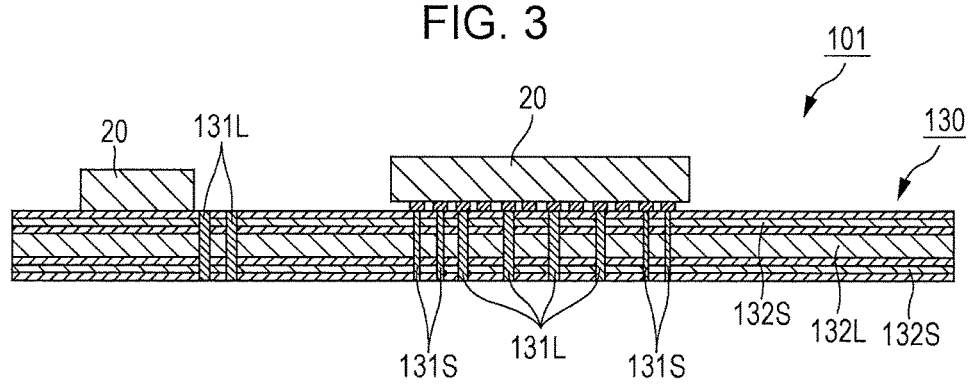
FIG. 3 illustrates an exemplary electronic apparatus according to a first comparative example.

FIG. 3 illustrates an exemplary electronic apparatus 101 according to a first comparative example. The electronic apparatus 101 according to the first comparative example includes a printed circuit board 130. The printed circuit board 130 includes a plurality of wiring layers 132S and 132L and electronic components 20 are mounted on the printed circuit board 130. The printed circuit board 130 includes a mixture of the wiring layer 132L that is for high current and the wiring layers 132S that are for low current. The wiring layer 132L for high current is made of a conductive plate or foil that is thicker than each of the wiring layers 132S for low current. When via holes in which vias 131L for high current and vias 131S for low current are to be formed are provided in the printed circuit board 130 including the wiring layer 132L for high current by using a drill, the drill may be broken. Specifically, a small-diameter drill used in providing via holes intended for the formation of the vias 131S for low current has a lower strength than a large-diameter drill used in providing via holes intended for the formation of the vias 131L for high current. The strength of the drill is reduced as the diameter of the via hole to be provided is reduced. A drill having a low strength is less capable of drilling through the thick wiring layer 132L for high current. That is, the electronic apparatus 101 according to the first comparative example has a trade-off between the increase in the thickness of the wiring layer 132L that occurs with the increase in the current supplied to the electronic components 20 and the reduction in the diameter of the vias 131S that occurs with the increase in the packaging density and the transmission speed of the electronic components 20. Hence, in the electronic apparatus 101 according to the first comparative example, it is difficult to realize both the increase in the current supplied to the electronic components 20 and the increase in the packaging density and the transmission speed of the electronic components 20.

Figure 4:
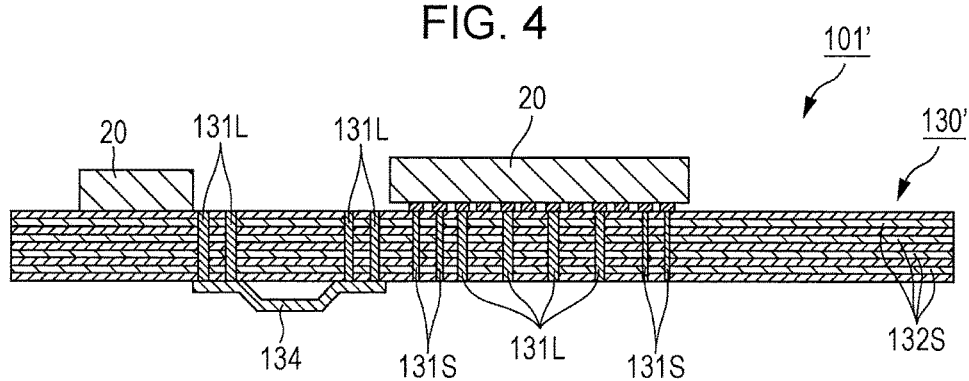
FIG. 4 illustrates an exemplary electronic apparatus according to a second comparative example.

FIG. 4 illustrates an exemplary electronic apparatus 101' according to a second comparative example. The electronic apparatus 101' according to the second comparative example differs from the electronic apparatus 101 according to the first comparative example in including a printed circuit board 130' that includes only the wiring layers 132S for low current, unlike the printed circuit board 130. That is, the printed circuit board 130' of the electronic apparatus 101' according to the second comparative example does not include any wiring layer that corresponds to the wiring layer 132L for high current provided in the printed circuit board 130 of the electronic apparatus 101 according to the first comparative example. Instead, the printed circuit board 130' includes a bus bar 134 provided at a position where a high current flows, whereby the lack of thickness corresponding to the wiring layers 132S is compensated for. Nevertheless, to maintain the packaging density and the transmission speed of the electronic components 20, the bus bar 134 has to be provided at a position that does not overlap the area where the electronic components 20 are mounted, as illustrated in FIG. 4. Such a situation increases the resistance loss in the current flowing from the area where the electronic components 20 are mounted to the position where the bus bar 134 is provided.

Figure 5:
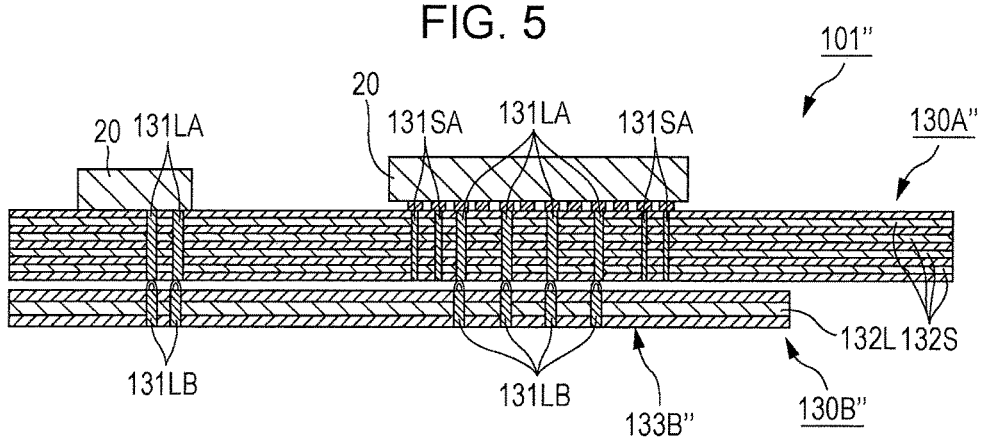
FIG. 5 illustrates an exemplary electronic apparatus according to a third comparative example.

FIG. 5 illustrates an exemplary electronic apparatus 101" according to a third comparative example. The electronic apparatus 101" according to the third comparative example includes a printed circuit board 130A" including wiring layers 132S for low current, and a printed circuit board 130B" including a wiring layer 132L for high current. The printed circuit board 130B" is joined to the printed circuit board 130A". Vias 131LA for high current provided in the printed circuit board 130A" allow a circuit 133B" provided in the printed circuit board 130B" to be electrically connected with the electronic components 20. In the electronic apparatus 101" according to the third comparative example, vias 131SA for low current are provided only in the printed circuit board 130A", which includes no wiring layers 132L for high current. Hence, there is no need for a small-diameter drill used for forming the vias 131SA to penetrate through the wiring layer 132L for high current. In such a case, the printed circuit board 130B" of the electronic apparatus 101" according to the third comparative example is provided as a matter of convenience of drilling performed in providing the via holes. That is, the number of components of the electronic apparatus 101" is increased for the convenience of drilling.

In contrast, in the circuit board 10 and the electronic apparatus 1 according to the embodiment, wiring lines for low current are provided as the circuit 33 of the printed circuit board 30, and wiring lines for high current are provided as the circuit 16 of the circuit board 10, which is separate from the printed circuit board 30. Hence, via holes intended for the formation of the small-diameter vias 31S for low current may be easily provided in the printed circuit board 30 by using a small-diameter drill that is unbearable in the drilling of the wiring layer 15 for high current provided in the circuit board 10. Moreover, no bus bar intended for small-diameter vias are provided. In addition, the circuit board 10 also functions as a bolster plate that is provided in correspondence with the heat sink in the related art. Hence, the bolster plate provided in the related-art electronic apparatus may be omitted, avoiding the increase in the number of components of the electronic apparatus 1. Thus, the circuit board 10 and the electronic apparatus 1 according to the embodiment may each include electronic components that are operable with an increased current, at an increased packaging density, and at an increased transmission speed on the printed circuit board 30, which may be processed more easily than the printed circuit boards 130, 130', and 130" of the electronic apparatuses 101, 101', and 101" according to the first to third comparative examples.

The circuit board 10 including the wiring layer 15 for high current is suitable as, for example, a power supply mechanism that supplies power to the printed circuit board 30 including the electronic components 20. The circuit board 10 is not limited to such a power supply mechanism. The circuit 16 of the circuit board 10 may perform a processing for a current signal similar to that performed by the circuit 33 of the printed circuit board 30.

The circuit board 10 according to the embodiment functions as a bolster plate that is provided in correspondence with the heat sink in the related art. Therefore, the plate member 11 included in the circuit board 10 is preferably rigid enough to bear deformation that may occur in the state where the printed circuit board 30 is held between the circuit board 10 and the heat sink 40. However, the plate member 11 of the circuit board 10 is not limited to a plate member that is so rigid as not to undergo any deformation under, for example, any load generated by a spring X. The plate member 11 of the circuit board 10 preferably has such a rigidity that the amount of deformation of the plate member 11 falls within a range in which the printed circuit board 30 that has received a load is not damaged.

The circuit board 10 illustrated in FIG. 1 has a rectangular shape. The circuit board 10 according to the embodiment is not limited to a rectangular board. The circuit board 10 may have any other shape such as a square shape, a circular shape, an elliptical shape, a diamond shape, a polygonal shape, and so forth.

The circuit board 10 illustrated in FIG. 1 includes the terminals 12 that are concentratedly arranged in two areas on the surface of the plate member 11. The circuit board 10 according to the embodiment is not limited to such a circuit board including the terminals 12 that are concentratedly arranged in two areas on the surface of the plate member 11 as an example. The circuit board 10 preferably includes terminals 12 that are arranged in correspondence with the pattern of wiring lines included in the printed circuit board 30 to be joined to the circuit board 10.

The circuit board 10 illustrated in FIG. 1 includes eight holes 13 provided at edges of the plate member 11. The circuit board 10 according to the embodiment is not limited to such a circuit board having eight holes 13 provided at edges of the plate member 11. The circuit board 10 preferably includes an appropriate number of holes 13 provided in correspondence with the positions of holes that are provided in the heat sink 40 and that receive the respective bolts 41.

Figure 6:
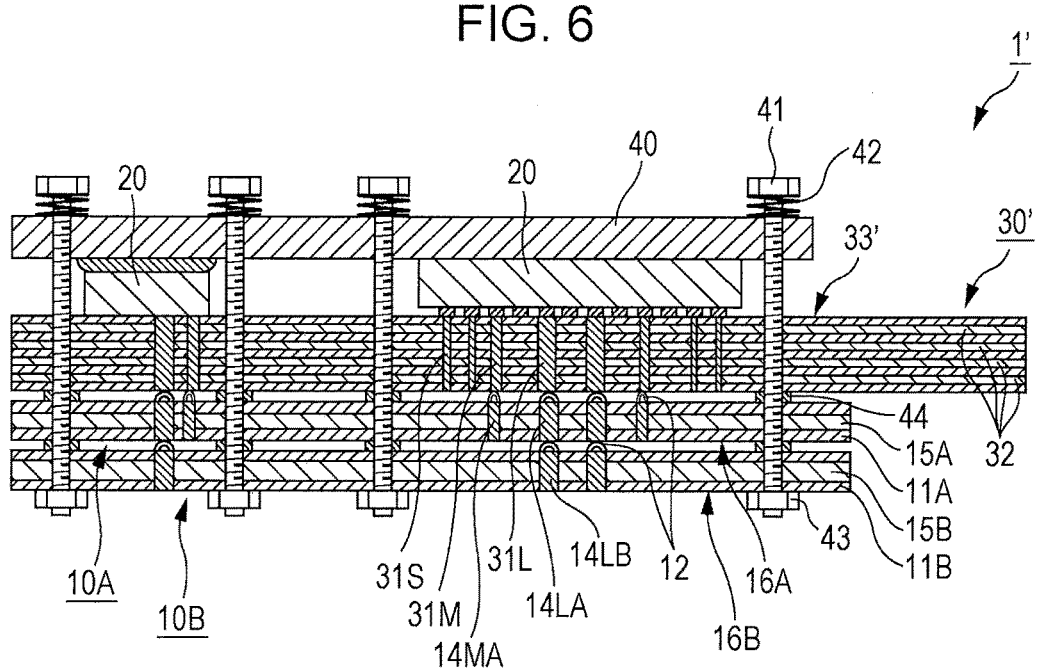
FIG. 6 illustrates an exemplary electronic apparatus according to a modification.

The electronic apparatus 1 according to the embodiment includes one circuit board 10. The electronic apparatus 1 according to the embodiment is not limited to an electronic apparatus including one circuit board 10, and may include two or more circuit boards 10. FIG. 6 illustrates an exemplary electronic apparatus 1' according to a modification. The electronic apparatus 1' according to the modification includes two circuit boards 10A and 10B that are joined to the back side of a printed circuit board 30'. The printed circuit board 30' of the electronic apparatus 1' according to the modification includes a circuit 33'. The circuit 33' includes large-diameter vias 31L, medium-diameter vias 31M, small-diameter vias 31S, and wiring layers 32. The circuit 33' is designed such that a current flowing through the large-diameter vias 31L is higher than a current flowing through the medium-diameter vias 31M, and a current flowing through the medium-diameter vias 31M is larger than a current flowing through the small-diameter vias 31S.

The circuit board 10A, which is nearer to the printed circuit board 30' than the circuit board 10B, includes large-diameter vias 14LA at positions corresponding to the large-diameter vias 31L provided in the printed circuit board 30', and medium-diameter vias 14MA at positions corresponding to the medium-diameter vias 31M provided in the printed circuit board 30'. The large-diameter vias 14LA and the medium-diameter vias 14MA are allowed to be electrically connected with the large-diameter vias 31L and the medium-diameter vias 31M, respectively, by the terminals 12. The large-diameter vias 14LA and the medium-diameter vias 14MA are also electrically connected with a wiring layer 15A embedded in a plate member 11A included in the circuit board 10A.

The circuit board 10B, which is farther from the printed circuit board 30' than the circuit board 10A, includes large-diameter vias 14LB at positions corresponding to the large-diameter vias 31L provided in the printed circuit board 30'. The large-diameter vias 14LB are allowed to be electrically connected with the large-diameter vias 31L of the printed circuit board 30' by the terminals 12 and the large-diameter vias 14LA. The large-diameter vias 14LB are also electrically connected with a wiring layer 15B embedded in a plate member 11B included in the circuit board 10B.

When two or more circuit boards, such as the circuit boards 10A and 10B, are provided as in the case of the electronic apparatus 1' according to the modification, wiring lines for low current may be achieved by the circuit 33' included in the printed circuit board 30', wiring lines for medium current may be achieved by a circuit 16A included in the circuit board 10A, and wiring lines for high current may be achieved by a circuit 16B included in the circuit board 10B. Hence, via holes intended for the formation of the small-diameter vias 31S for low current may be easily provided in the printed circuit board 30' by using a small-diameter drill that is unbearable in the drilling of the wiring layer 15B for high current provided in the circuit board 10B. Furthermore, via holes intended for the formation of the medium-diameter vias 31M for medium current may be easily provided in the circuit board 10A by using a medium-diameter drill that is unbearable in the drilling of the wiring layer 15B for high current provided in the circuit board 10B. That is, when two or more circuit boards, such as the circuit boards 10A and 10B, are provided as in the case of the electronic apparatus 1' according to the modification, an electronic apparatus including circuits through which various levels of currents flow may be provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A circuit board comprising:
   a plate member configured to hold a printed circuit board on which an electronic component is directly mounted, and a cooling member provided above the electronic component and including a conductive plate or a conductive foil provided between a first member and a second member and a hole through which a fastening member that fastens the cooling member and the plate member together is allowed to extend from the first member to the second member, the printed circuit board including layered wiring layers provided above the first member and the second member, the printed circuit board and the electronic component being positioned between the plate member and the cooling member; and a circuit provided to the plate member and allowed to be electrically coupled with the printed circuit board, wherein the conductive plate or the conductive foil is thicker than each of the layered wiring layers.

2. The circuit board according to claim 1, wherein a terminal that allows the printed circuit board and the circuit to be coupled to each other is provided on a surface of the plate member.

3. The circuit board according to claim 2, wherein the terminal is elastically deformable.

4. The circuit board according to claim 1, wherein the printed circuit board includes a large-diameter via and a small-diameter via having a smaller diameter than the large-diameter via which penetrate the layered conductive plates or the layered conductive foils.

5. The circuit board according to claim 4, wherein the circuit includes a via coupled to the large-diameter via through a terminal provided between the plate member and the printed circuit board.

6. An electronic apparatus comprising:
a printed circuit board on which an electronic component is directly mounted;
a cooling member provided above the electronic component; and
a circuit board including a plate member that holds the printed circuit board and the electronic component and includes a conductive plate or a conductive foil provided between a first member and a second member and a hole through which a fastening member that fastens the cooling member and the plate member together is allowed to extend from the first member to the second member, the printed circuit board including layered wiring layers provided above the first member and the second member, the printed circuit board and the electronic component being positioned between the plate member and the cooling member, and a circuit provided to the plate member and that is electrically coupled with the printed circuit board, wherein the conductive plate or the conductive foil is thicker than each of the layered wiring layers.

7. The electronic apparatus according to claim 6, wherein a terminal that couples the printed circuit board and the circuit to each other is provided above a surface of the plate member.

8. The electronic apparatus according to claim 7, wherein the terminal is elastically deformable.

9. The electronic apparatus according to claim 6, wherein the printed circuit board includes a large-diameter via and a small-diameter via having a smaller diameter than the large-diameter via which penetrate the layered conductive plates or the layered conductive foils.

10. The electronic apparatus according to claim 9, wherein the circuit includes a via coupled to the large-diameter via through a terminal provided between the plate member and the printed circuit board.

* * * * *